(12) United States Patent
Chu et al.

(10) Patent No.: US 9,343,620 B2
(45) Date of Patent: May 17, 2016

(54) METHOD FOR FABRICATING A LIGHT EMITTING DIODE (LED) DIE HAVING PROTECTIVE SUBSTRATE

(71) Applicant: SemiLEDS Optoelectronics Co., Ltd., Chu-Nan (TW)

(72) Inventors: Jiunn-Yi Chu, Chubei (TW); Chen-Fu Chu, Hsinchu (TW); Chao-Chen Cheng, Hsinchu (TW)

(73) Assignee: SemiLEDS Optoelectronics Co., Ltd., Chu-nan (TW)

( * ) Notice: Subject to any disclaimer, the term of this patent is extended or adjusted under 35 U.S.C. 154(b) by 35 days.

(21) Appl. No.: 14/175,033

(22) Filed: Feb. 7, 2014

(65) Prior Publication Data

US 2014/0151635 A1 Jun. 5, 2014

Related U.S. Application Data

(63) Continuation of application No. 13/325,376, filed on Dec. 14, 2011, now Pat. No. 8,686,461, and a continuation-in-part of application No. 12/983,436, filed on Jan. 3, 2011, now abandoned.

(51) Int. Cl.
| | |
|---|---|
| *H01L 21/00* | (2006.01) |
| *H01L 33/06* | (2010.01) |
| *H01L 33/20* | (2010.01) |
| *H01L 33/38* | (2010.01) |

(Continued)

(52) U.S. Cl.
CPC ............ *H01L 33/06* (2013.01); *H01L 33/0075* (2013.01); *H01L 33/0079* (2013.01); *H01L 33/10* (2013.01); *H01L 33/20* (2013.01); *H01L 33/32* (2013.01); *H01L 33/38* (2013.01); *H01L 33/405* (2013.01); *H01L 33/647* (2013.01); *H01L 33/0095* (2013.01); *H01L 2933/0016* (2013.01)

(58) Field of Classification Search
CPC .......................... H01L 33/0079; H01L 33/38
USPC .................... 257/99, 684, E33.057, E33.058, 257/E33.006; 438/26, 27, 28
See application file for complete search history.

(56) References Cited

U.S. PATENT DOCUMENTS

| | | | |
|---|---|---|---|
| 6,703,290 B2 | 3/2004 | Boyston et al. | |
| 6,720,586 B1 | 4/2004 | Kidoguchi et al. | |

(Continued)

OTHER PUBLICATIONS

Office Action in U.S. Appl. No. 12/983,436 dated May 22, 2012, pp. 1-9.

(Continued)

*Primary Examiner* — Kimberly Rizkallah
*Assistant Examiner* — Maria Ligai
(74) *Attorney, Agent, or Firm* — Stephen A. Gratton

(57) ABSTRACT

A method for fabricating a light emitting diode die includes the steps of providing a carrier substrate and forming an epitaxial structure on the carrier substrate including a first type semiconductor layer, a multiple quantum well (MQW) layer on the first type semiconductor layer configured to emit light, and a second type semiconductor layer on the multiple quantum well (MQW) layer. The method also includes the steps of forming a plurality of trenches through the epitaxial structure, forming a reflector layer on the second type semiconductor layer, forming a seed layer on the reflector layer and in the trenches, and forming a substrate on the seed layer having an area configured to protect the epitaxial structure.

14 Claims, 7 Drawing Sheets

(51) Int. Cl.
*H01L 33/00* (2010.01)
*H01L 33/40* (2010.01)
*H01L 33/64* (2010.01)
*H01L 33/10* (2010.01)
*H01L 33/32* (2010.01)

(56) References Cited

U.S. PATENT DOCUMENTS

| | | |
|---|---|---|
| 7,186,580 B2 | 3/2007 | Tran et al. |
| 7,195,944 B2 | 3/2007 | Tran et al. |
| 7,378,288 B2 | 5/2008 | Tran et al. |
| 7,432,119 B2 | 10/2008 | Doan |
| 7,473,936 B2 | 1/2009 | Tran et al. |
| 7,524,686 B2 | 4/2009 | Chu et al. |
| 7,563,625 B2 | 7/2009 | Tran et al. |
| 7,615,789 B2 | 11/2009 | Tran |
| 7,629,195 B2 | 12/2009 | Tran et al. |
| 7,646,033 B2 | 1/2010 | Tran et al. |
| 7,687,322 B1 | 3/2010 | Doan et al. |
| 7,723,718 B1 | 5/2010 | Doan et al. |
| 7,759,146 B2 | 7/2010 | Tran |
| 7,759,670 B2 | 7/2010 | Liu et al. |
| 7,781,247 B2 | 8/2010 | Tran |
| 7,781,783 B2 | 8/2010 | Yen et al. |
| 7,811,842 B2 | 10/2010 | Liu et al. |
| 8,105,852 B2 | 1/2012 | Gardner et al. |
| 8,686,461 B2 | 4/2014 | Chu et al. |
| 2004/0238837 A1 | 12/2004 | Jacob et al. |
| 2005/0017253 A1 | 1/2005 | Hata |
| 2006/0102925 A1* | 5/2006 | Liu et al. .......... 257/103 |
| 2007/0069231 A1 | 3/2007 | Namioka |
| 2008/0032488 A1 | 2/2008 | Chu et al. |
| 2008/0035950 A1 | 2/2008 | Chu et al. |
| 2008/0087875 A1 | 4/2008 | Fan et al. |
| 2008/0194051 A1 | 8/2008 | Chu et al. |
| 2008/0274572 A1 | 11/2008 | Tran |
| 2008/0308829 A1 | 12/2008 | Liu et al. |
| 2009/0014738 A1 | 1/2009 | Shiue et al. |
| 2009/0093075 A1* | 4/2009 | Chu et al. .......... 438/33 |
| 2010/0032701 A1* | 2/2010 | Fudeta .......... 257/98 |
| 2011/0140076 A1 | 6/2011 | Song |
| 2011/0175124 A1* | 7/2011 | Bae et al. .......... 257/98 |
| 2011/0220933 A1 | 9/2011 | Gotoda et al. |
| 2011/0227121 A1 | 9/2011 | Kato et al. |
| 2012/0168714 A1 | 7/2012 | Chu et al. |
| 2012/0168716 A1 | 7/2012 | Chu et al. |

OTHER PUBLICATIONS

Final Office Action in U.S. Appl. No. 12/983,436 dated Dec. 28, 2012, pp. 1-12.
Office Action in U.S. Appl. No. 12/983,436 dated Jul. 24, 2013, pp. 1-11.
Office Action in U.S. Appl. No. 13/325,376 dated Jun. 5, 2013, pp. 1-12.
Office Action in U.S. Appl. No. 13/325,376 dated Oct. 17, 2013, pp. 1-12.
Notice of Allowance in U.S. Appl. No. 13/325,376 dated Nov. 14, 2013, pp. 1-12.

* cited by examiner

US 9,343,620 B2

METHOD FOR FABRICATING A LIGHT EMITTING DIODE (LED) DIE HAVING PROTECTIVE SUBSTRATE

CROSS REFERENCE TO RELATED APPLICATIONS

This application is a continuation of Ser. No. 13/325,376 filed Dec. 14, 2011, U.S. Pat. No. 8,686,461B2, which is a continuation-in-part of Ser. No. 12/983,436 filed Jan. 3, 2011, abandoned.

BACKGROUND

This disclosure relates generally to optoelectronic components and more particularly to a light emitting diode (LED) die and method of fabrication.

An optoelectronic system, such as a light emitting diode (LED), can include one or more light emitting diode (LED) dice mounted to a substrate. One type of light emitting diode (LED) die, known as a vertical light emitting diode (VLED) die, includes a multi-layer semiconductor substrate made of a compound semiconductor material, such as GaN. The semiconductor substrate can include a p-type confinement layer having p-type dopants, an n-type confinement layer having n-type dopants, and a multiple quantum well (MQW) layer located between the confinement layers configured to emit light.

The present disclosure is directed to a light emitting diode (LED) die and method of fabrication. The light emitting diode (LED) die can be used to construct light emitting diodes having improved thermal and electrical characteristics.

SUMMARY

A light emitting diode (LED) die includes a first substrate having a first surface and an opposing second surface, a second substrate on the second surface of the first substrate, and an epitaxial stack on the first substrate. The first substrate and the second substrate can have a geometry configured to form a stepped structure for protecting the epitaxial stack.

A method for fabricating the light emitting diode (LED) die includes the steps of: providing a carrier substrate, forming an epitaxial stack on the carrier substrate, forming a first substrate on the epitaxial stack having a first area, forming a second substrate on the first substrate having a second area less than the first area, removing the carrier substrate, and separating the dice into a plurality of separate light emitting diode dice.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 1B:
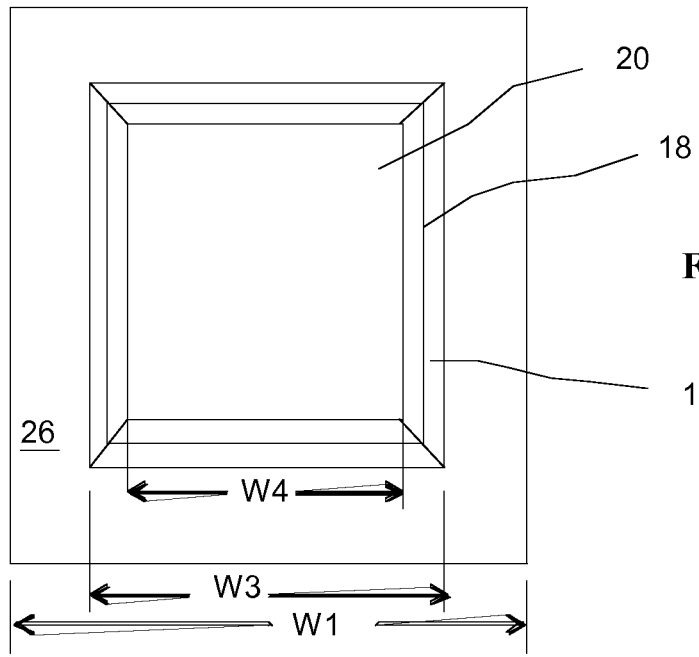
FIG. 1B is a schematic plan view of the light emitting diode (LED) die.
Figure 1A:
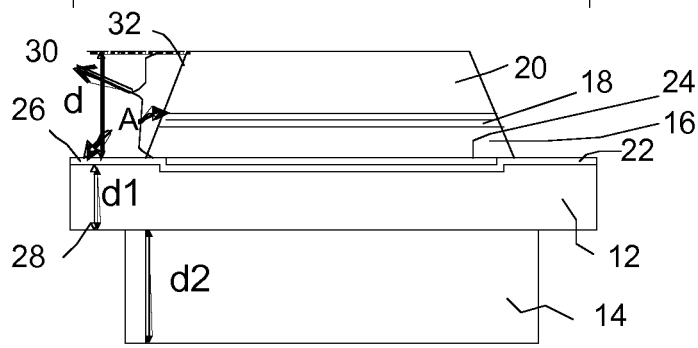
FIG. 1A is a schematic cross sectional view of a light emitting diode (LED) die.
Figure 1C:
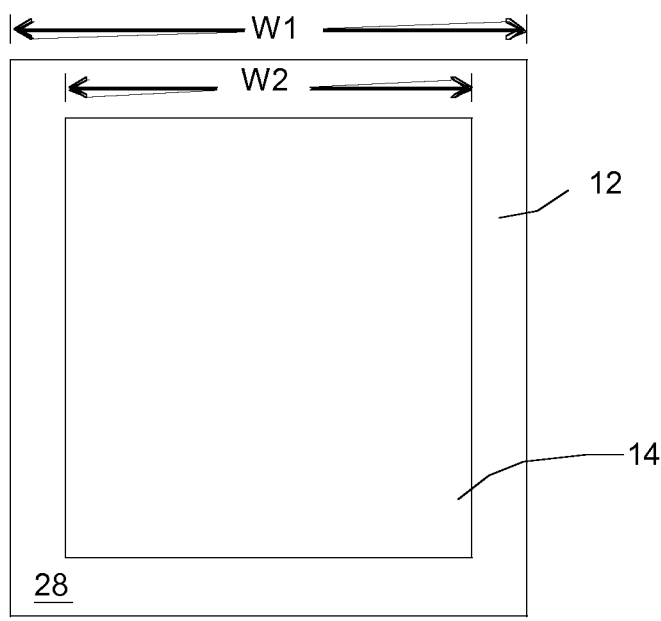
FIG. 1C is a schematic bottom view of the light emitting diode (LED) die.

Referring to FIGS. 1A-1C, a light emitting diode (LED) die 10 (FIG. 1A) includes a first substrate 12; a second substrate 14; a p-type semiconductor layer 16 on the first substrate 12; a multiple quantum well (MQW) layer 18 on the p-type semiconductor layer 16; and an n-type semiconductor layer 20 on the multiple quantum well (MQW) layer 18. The light emitting diode die (LED) 10 can also include a seed layer 22 (FIG. 1A) on the first substrate 12 and a reflector layer 24 (FIG. 1A) on the seed layer 22. Although a vertical light emitting diode (VLED) is being described, it is to be understood that this configuration for the light emitting diode (LED) die 10 is merely exemplary, and other configurations for light emitting diode dice, including non vertical configurations, can be employed.

A preferred material for the p-type semiconductor layer 16 comprises p-GaN. Other suitable materials for the p-type layer include AlGaN, InGaN and AlInGaN. A preferred material for the n-type semiconductor layer 20 comprises p-GaN. Other suitable materials for the n-type layer include AlGaN, InGaN and AlInGaN. The multiple quantum well (MQW) layer 18 can comprise a semiconductor material, such as GaAs, sandwiched between two layers of a semiconductor material, such as AlAs having a wider bandgap.

The first substrate 12 (FIG. 1A) includes a first surface 26 (FIG. 1A) and an opposing second surface 28 (FIG. 1A). The reflector layer 24 (FIG. 1A) is formed on the first surface 26 (FIG. 1A), and the second substrate 14 (FIG. 1A) is formed on the second surface 28 (FIG. 1A). As shown in FIG. 1B, the first substrate 12 (FIG. 1A) has a generally square peripheral outline with four equal sides. Alternately, the first substrate 12 (FIG. 1A) can have any suitable polygonal peripheral outline (e.g., rectangular, triangular), or a circular outline. In addition, the first substrate 12 (FIG. 1A) has a thickness (d1) (FIG. 1A) and a width (W1) (FIG. 1B) on each side. A representative range for the thickness (d1) of the first substrate 12 can be from 1 μm to 500 μm. A representative range for the width (W1) of the first substrate 12 can be from 1 μm to 10000 μm. In the case of a circular outline, the width (W1) would be equivalent to the diameter (D) of the circle. A representative value for the area of the first substrate 12 (FIG. 1A) can be from 1 μm$^2$ to 10$^8$ μm$^2$.

The first substrate 12 (FIG. 1A) can comprise a single metal layer or a stack of two or more metal layers, formed using a suitable deposition process. In addition, the material for the first substrate 12 is selected to provide a high electrical conductivity and a high thermal conductivity. Suitable materials for the first substrate 12 include W, Ti, Mo, Al, Cu, Ni, Ag, Au, Co, Cu—Co, Ni—Co, Cu—Mo, Ni/Cu, Ni/Cu—Mo and alloys of these metals. Suitable deposition processes for forming the first substrate 12 include electro-deposition, electroless-deposition, chemical vapor deposition (CVD), plasma enhanced chemical vapor deposition (PECVD), physical vapor deposition (PVD), evaporation, and plasma spray. Rather than being a metal, the first substrate 12 can comprise a semiconductor material, such as Si, or another material, such SiO$_2$, GaAs, SiC, AlN, Al$_2$O$_3$, or sapphire.

The second substrate 14 (FIG. 1A) has a generally square peripheral outline with four equal sides centered symmetrically on the first substrate 12. Alternately, the second substrate 14 (FIG. 1A) can have any suitable peripheral outline (e.g., rectangular, triangular) and can be offset on the first substrate. As another alternative the second substrate 14 (FIG. 1A), and the first substrate 12 (FIG. 1A) as well, can have a circular peripheral outline, and a concentric alignment. In addition, the second substrate 14 (FIG. 1A) has a thickness (d2) (FIG. 1A) and a width (W2) (FIG. 1B) on each side. A representative range for the thickness (d2) can be from 1 µm to 500 µm. A representative range for the width (W2) can be from 0.5 µm to 9999 µm. The maximum width (W2) and area of the second substrate 14 (FIG. 1A) are dependant on the geometry but are less than the maximum width (W1) and area of the first substrate 12 (FIG. 1A). Stated differently, the maximum width (W1) and area of the first substrate 12 (FIG. 1A) are greater than the maximum width (W2) and area of the second substrate 14 (FIG. 1A). As such, the first substrate 12 (FIG. 1A) and the second substrate 14 (FIG. 1A) form a stepped protective structure. In the claims to follow, the area of the first substrate 12 is referred to as the "first area", and the area of the second substrate 14 is referred to as the "second area".

The second substrate 14 (FIG. 1A) can comprise a single metal layer, or a stack of two or more metal layers formed using a suitable deposition process. In addition, the material for the second substrate 14 is selected to provide a high electrical conductivity and a high thermal conductivity. Suitable materials for the second substrate 14 include W, Ti, Mo, Al, Cu, Ni, Ag, Au, Co, Cu—Co, Ni—Co, Cu—Mo, Ni/Cu, Ni/Cu—Mo and alloys of these metals. Suitable deposition processes for the second substrate 14 include electro-deposition, electroless-deposition, chemical vapor deposition (CVD), plasma enhanced chemical vapor deposition (PECVD), physical vapor deposition (PVD), evaporation, and plasma spray. Rather than being formed of a metal, the second substrate 14 can comprise a semiconductor material, such as Si, or another material, such $SiO_2$, GaAs, SiC, AlN, $Al_2O_3$, or sapphire. In addition, both the first substrate and the second substrate can comprise a same material or a different material.

The seed layer 22 (FIG. 1A) can comprise a blanket deposited metal layer formed using a suitable deposition process, such as electro-deposition or electroless deposition. As will be further explained, the seed layer 22 is configured to assist the formation of the first substrate 12 and the second substrate 14 using a suitable deposition process, such as electroplating or electroless plating. In addition, the seed layer 22 can comprise a single metal layer or a metal stack. Suitable materials for the seed layer 22 include Ta/Cu, Ta/TaN/Cu/TaN/Cu, Ti/TaN/Cu/Ta/TiN/Cu, Ti/Cu, Ti/Tn/Cu/TiN/Cu, Cr/Au, Cr/Au/Ni/Au, Cr/Au/Ti/Ni/Au, Ti/Au and Ti/Ni/Au. The reflector layer 24 can also comprise a single metal layer or a metal stack. Suitable materials for the reflector layer 24 include Ag/Ti/Au, Ag/TiN/Cu, Ag/Ta/Au, Ag/W/Au, Ag/TaN/Cu, Ag/Ni/Au, Al/Ta/Au, Al/TaN/Cu, Ni/Ag, Ni/Al and Ni/Ag/Ni/Au.

The p-type semiconductor layer 16 (FIG. 1A), the multiple quantum well (MQW) layer 18 (FIG. 1A) and the n-type semiconductor layer 20 (FIG. 1A) form an epitaxial stack 30 (FIG. 1A) having a thickness (d) on the seed layer 22. In the epitaxial stack 30, the p-type semiconductor layer 16 (FIG. 1A) and the n-type semiconductor layer 20 (FIG. 1A) function as confinement layers, and the multiple quantum well (MQW) layer 18 (FIG. 1A) functions as a light emitting layer.

The epitaxial stack 30 (FIG. 1A) can be formed on the reflector layer 24 using a suitable deposition process, such as vapor phase epitaxy (VPE), molecular beam epitaxy (MBE) or liquid phase epitaxy (LPE). A representative range for the thickness (d) of the epitaxial stack 30 can be from 1 µm to 50 µm. In addition, the epitaxial stack 30 (FIG. 1A) has four sloped side walls 32 (FIG. 1A) formed at an angle (A) from the surface of the seed layer 22 (FIG. 1A), where the surface of the seed layer 22 (FIG. 1A) is parallel to the first surface 26 (FIG. 1A) of the first substrate 12 (FIG. 1A). The angle (A) is greater than 90 degrees, with a representative range for the angle (A) being from 100 degrees to 145 degrees. In addition, the epitaxial stack 30 (FIG. 1A) is generally pyramidal in shape with a flat top (rather than pointed as with a true pyramid). Further, the reflector layer 24 can have an area and a maximum width that are less than an area and maximum width of the p-type semiconductor layer 16.

The epitaxial stack 30 (FIG. 1A) has a four-sided base portion formed by the p-type semiconductor layer 16 with a width (W3), and a four-sided tip portion formed by the n-type semiconductor layer 20 with a width (W4). The maximum width (W4) of the n-type semiconductor layer 20 is less than the maximum width (W3) of the p-type semiconductor layer 16. In addition, the area of the tip portion of the epitaxial stack 30 (FIG. 1A) formed by the top surface of the n-type layer, is less than the area of the base portion of the epitaxial stack 30 (FIG. 1A) formed by the bottom surface p-type semiconductor layer 16 (FIG. 1A). Stated differently, the cross sectional area of the epitaxial stack 30 (FIG. 1A) decreases from the base portion to the tip portion. Rather than being generally pyramidal in shape, the epitaxial stack 30 (FIG. 1A) can be generally conical in shape with a circular base and flat, circular tip portion. As another alternative, the epitaxial stack 30 (FIG. 1A) can have an elongated rectangular base portion, and an elongated pyramidal shape.

Figure 2:
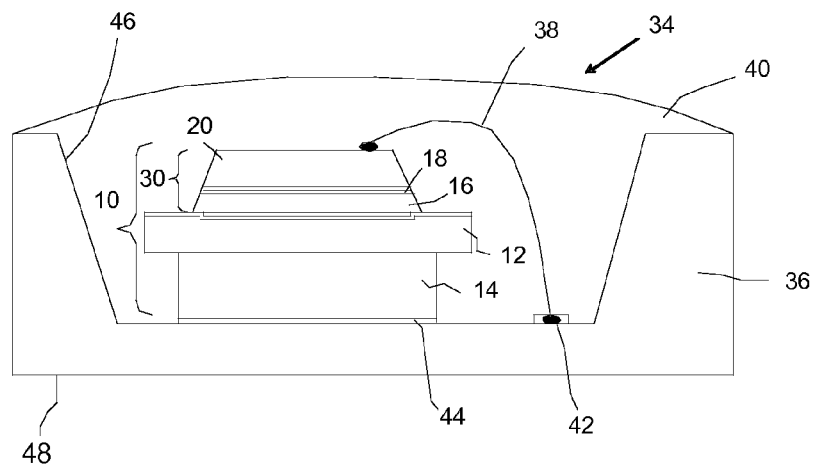
FIG. 2 is a schematic cross sectional view of a light emitting diode system incorporating the light emitting diode (LED) die.

Referring to FIG. 2, a light emitting diode (LED) 34 includes a substrate 36, the light emitting diode (LED) die 10 mounted to the substrate 36, and an electrically insulating, light transmissive passivation layer 40 which encapsulates the light emitting diode (LED) die 10. For illustrative purposes in FIG. 2, the light emitting diode (LED) 34 is shown with only one light emitting diode (LED) die 10 mounted to the substrate 36. However, in actual practice the light emitting diode (LED) 34 can include a plurality of light emitting diode (LED) dice 10 mounted to the substrate 36, and arranged in a desired array to form an optoelectronic device, such as an LED display. The substrate 36 can comprise a semiconductor material, such as silicon (Si), or another material, such GaAs, SiC, AlN, $Al_2O_3$, or sapphire. The substrate 36 includes a cavity 46 wherein the light emitting diode (LED) die 10 is mounted, and a back side 48. An electrically conductive die attach layer (not shown) can be used to attach the light emitting diode (LED) die 10 to the substrate 36.

As shown in FIG. 2, a wire bonded wire 38 electrically connects the n-type semiconductor layer 20 to an n-electrode 42 on the substrate 36. In addition, the first substrate 12 and the second substrate 14 electrically connect the p-type semiconductor layer 16 to a p-electrode 44 on the substrate 36. The first substrate 12 and the second substrate 14 also provide a heat transfer path from the light emitting diode (LED) die 10 to the substrate 36. This heat transfer path is enhanced by the stepped structure provided by the first substrate 12 and the second substrate 14. In addition, the larger first substrate 12 provides a protective structure or "overhang" that prevents a die attach material, such as Ag paste or solder, from overflowing and contacting the epitaxial stack 30.

Figure 3A:
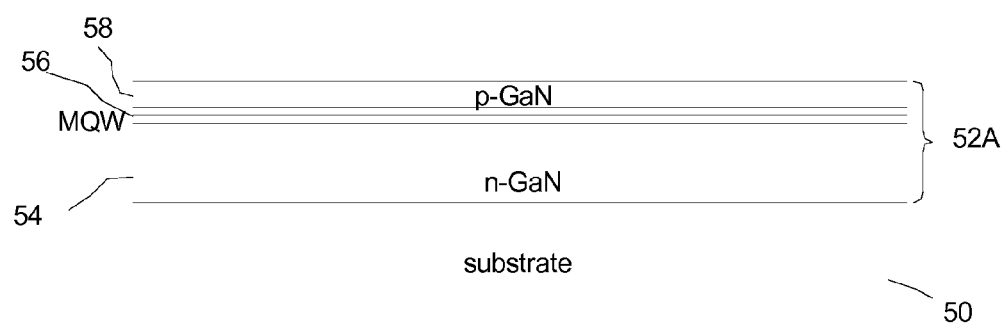
FIGS. 3A-3K are schematic cross sectional views illustrating steps in a method for fabricating the light emitting diode (LED) die.

Referring to FIGS. 3A-3K, steps in a method for fabricating the light emitting diode (LED) die 10 are illustrated. Initially, as shown in FIG. 3A, a carrier substrate 50 is provided. The carrier substrate 50 can be in the form of a wafer comprised of a suitable material, such as sapphire, silicon carbide (SiC), silicon, germanium, zinc oxide (ZnO), or gallium arsenide (GaAs). In the examples to follow the carrier substrate 50 comprises sapphire.

As also shown in FIG. 3A, a multi layer epitaxial structure 52A is formed on the carrier substrate 50 using a suitable deposition process such as vapor phase epitaxy (VPE), molecular beam epitaxy (MBE) or liquid phase epitaxy (LPE). The multi layer epitaxial structure 52A includes an n-type layer 54, one or more quantum well layers 56, and a p-type layer 58. In the illustrative embodiment, the n-type layer 54 comprises n-GaN and the p-type layer 58 comprises p-GaN. Rather than GaN, the n-type layer 54 and the p-type layer 58 can comprise various other compound semiconductor materials, such as AlGaN, InGaN, and AlInGaN. The quantum well layers 56 can be formed of suitable materials such as a GaAs layer sandwiched between two layers of a material with a wider bandgap such as AlAs.

Figure 3B:
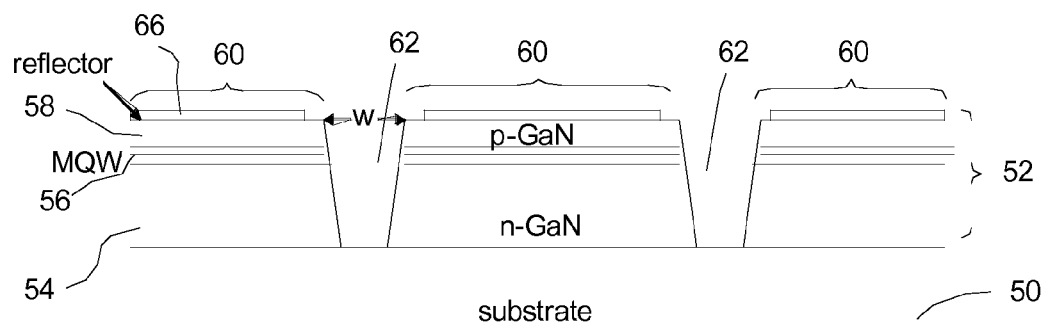

Next as shown in FIG. 3B, a suitable process can be used to form trenches 62 through the epitaxial structure 52A (FIG. 3A) that can endpoint on the substrate 50 as shown, or alternately that can extend a short distance into the substrate 50. The trenches 62 can be formed in a criss-cross pattern similar to the streets between dice in a conventional semiconductor fabrication process, such that a plurality of defined dice 60, and separate epitaxial stacks 52, are formed. A suitable process for forming the trenches 62 comprises dry etching through a hard mask. Other suitable processes include laser cutting, saw cutting, diamond cutting, wet etching, and water jetting. After the trench forming process, the dice 60 may be cleaned in a liquid or a solvent to remove the etch mask, or other protective coating. A width (w) of the trenches 62 can be in a range of from about 0.1 μm to about 300 μm.

As also shown in FIG. 3B, a suitable process can be used to form a reflector layer 66 on the p-type layer 58, that functions as a reflector or mirror for photons in the light emitting diode (LED) die 10. By way of example, the reflector layer 66 can comprise multiple layers, such as Ni/Ag/Ni/Au, Ag/Ni/Au, Ti/Ag/Ni/Au, Ag/Pt or Ag/Pd or Ag/Cr, formed by depositing an alloy containing Ag, Au, Cr, Pt, Pd, or Al. A thickness of the reflector layer 66 (mirror) can be less than about 1.0 μm. High temperature annealing or alloying of the reflector layer 66 can be used to improve the contact resistance and adhesion of the reflector layer 66 to the p-type layer 58. For example, the annealing or alloying process can be conducted at a temperature of at least 150° C. in an inert environment (e.g., an atmosphere containing little or no oxygen, hydrogen, or neither oxygen nor hydrogen).

Figure 3C:
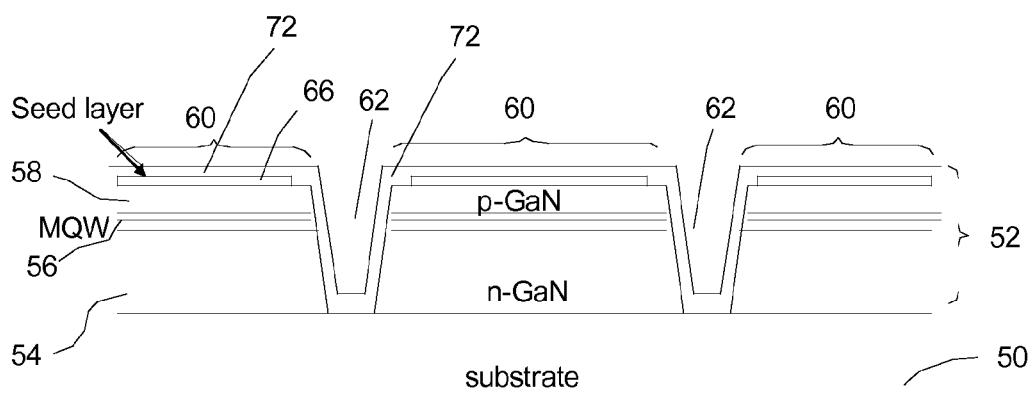

Next, as shown in FIG. 3C, a seed layer 72 can be formed on the reflector layer 66 and on the sidewalls of the trenches 62 using an electroplating or an electroless plating process. The seed layer 72 can comprise a single layer or a stack such as Ta/Cu, Ta/TaN/Cu, TaN/Cu, Ti/TaN/Cu, Ta/TiN/Cu, Ti/Cu, Ti/Tn/Cu, TiN/Cu, Ti/Cu, Ti/Tn/Cu, TiN/Cu, Cr/Au, Cr/Au/Ni/Au, Cr/Au/Ti/Ni/Au, Ti/Au, Ti/Ni/Au, Ni/Au or Ni/Cu. The reflector layer 66 can also be formed as a blanket layer that may also act as a seed layer. In this case, the reflector layer 66 can comprise a single layer, or stacked layers, such as Ag/Ti/Au, Ag/TiN/Cu, Ag/Ta/Au, Ag/W/Au, Ag/TaN/Cu, Al/Ta/Au, Al/TaN/Cu, Ni/Ag, Ni/Al or Ni/Ag/Ni/Au.

Figure 3D:
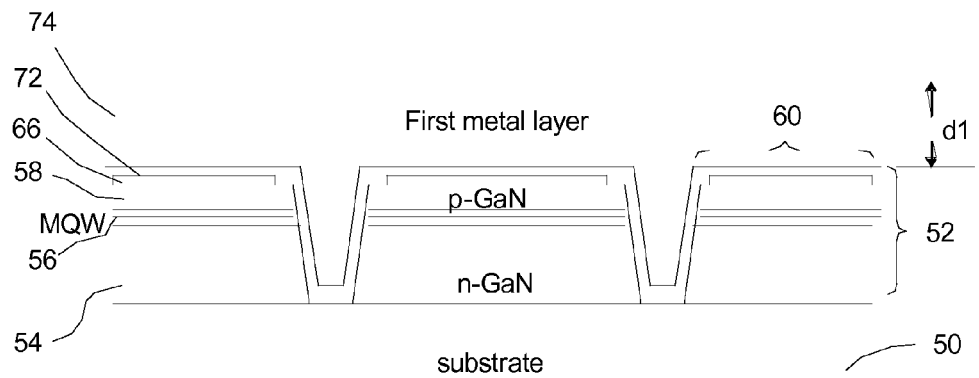
Figure 3E:
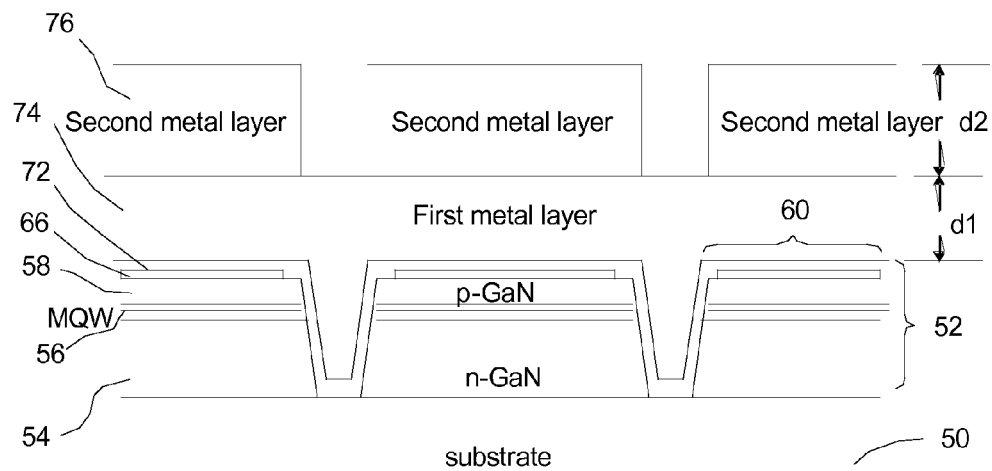

Next, as shown in FIGS. 3D and 3E, a first substrate layer 74 is deposited on the seed layer 72 to a thickness of d1, and a second substrate layer 76 is deposited on the first substrate layer 74 to a thickness of d2. The first substrate layer 74 will form the first substrate 12 (FIG. 1A), and the second substrate layer 76 will form the second substrate 14 (FIG. 1A) light emitting diode (LED) die 10 (FIG. 1A). The first substrate layer 74 can be formed using a suitable deposition process, such as an electro-deposition process or an electroless deposition process, to a desired thickness d1. A representative range for the thickness d1 of the first substrate layer 74 can be from 1 μm to 500 μm. Similarly, the second substrate layer 76 can be formed using a suitable deposition process, such as an electro-deposition process or an electroless deposition process, to a desired thickness d2. A representative range for the thickness d2 of the second substrate layer 76 can be from 1 μm to 500 μm. The first substrate layer 74 and the second substrate layer 76 can comprise a single layer of a metal such as W, Ti, Mo, Al, Cu, Ni, Ag, Au or Co, a metal alloy such as Cu—Co or Cu—Mo, or a metal stack such as Ni/Cu or Ni/Cu—Mo. Rather than being a metal, the first substrate layer 74 can comprise a semiconductor material, such as Si, or another material, such $SiO_2$, GaAs, SiC, AlN, $Al_2O_3$, or sapphire. Similarly, the second substrate layer 76 can comprise a semiconductor material, such as Si, or another material, such $SiO_2$, GaAs, SiC, AlN, $Al_2O_3$, or sapphire. Both the first substrate and the second substrate can be formed using a suitable deposition or growth process, substantially as described for a metal layer. Other suitable deposition processes for the first substrate layer 74 and the second substrate layer 76 include chemical vapor deposition (CVD), plasma enhanced chemical vapor deposition (PECVD), physical vapor deposition (PVD), evaporation, and plasma spray.

As also shown in FIG. 3E, the second substrate layer 76 can be patterned using a suitable process such as etching an initially deposited layer (e.g., subtractive process), or alternately patterned deposition through a mask (e.g., additive process), to define the shape of the second substrate 14. The second substrate layer 76 can be patterned such that an area and a width W2 (FIG. 1C) of the second substrate 14 is less than an area and a width W1 (FIG. 1C) of the first substrate 12. In addition, one or more additional metal layers such as Cr/Au, Ni or Ni/Au (not shown) can be formed on the second substrate layer 76 and on exposed surfaces of the first substrate layer 74 for oxidation and corrosion protection.

Figure 3F:
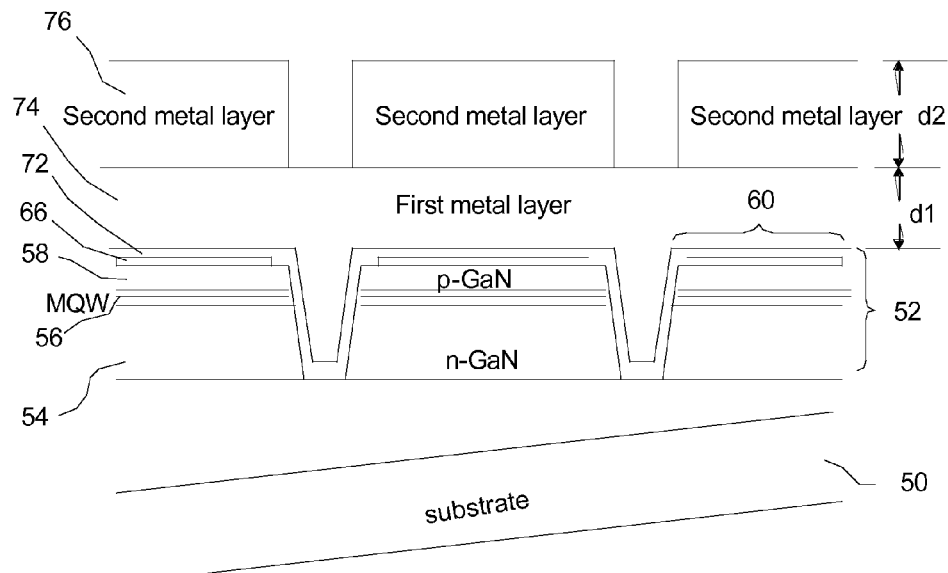

Next, as shown in FIG. 3F, the carrier substrate 50 can be removed from the n-type layer 54 using a suitable process such as a pulse laser irradiation process, etching, or chemical mechanical planarization (CMP).

Figure 3G:
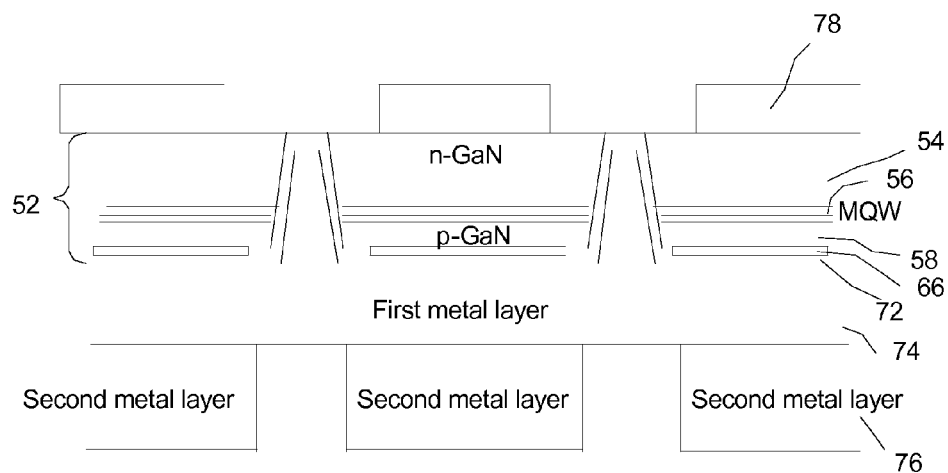

Next, as shown in FIG. 3G, a hard mask 78 can be formed on the surface of the n-type layer 54 from which the carrier substrate 50 has been removed. The hard mask 78 can comprise a grown or deposited material such as $SiO_2$ or $Si_3N_4$. Alternately, the hard mask 78 can comprise an organic polymer material, such as an epoxy, a polyimide, a thermoplastic or a sol-gel. A photo sensitive organic material, such as SU-8, NR-7, AZ5214E can also be employed. As another alternative, the hard mask 78 can comprise an inorganic material such as $SiO_2$, ZnO, $Ta_2O_5$, $TiO_2$, HfO, or MgO.

Figure 3H:
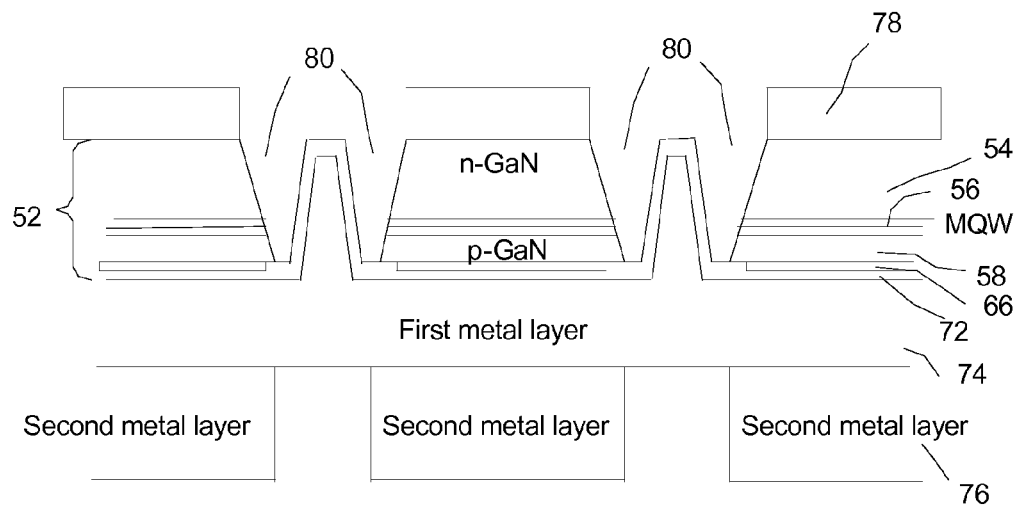

Next, as shown in FIG. 3H, the hard mask 78 can be used to etch trenches 80 through the epitaxial stack 52 to the seed layer 72. Etching can comprise dry etching (ICP RIE), wet chemical etching or photo-enhanced chemical etching. As also shown in FIG. 3H, the size of the trenches 80 in a region proximate to a surface of the n-type layer 54 can be larger than in a region proximate to the surface of the p-type layer 58. Stated differently, the trenches 80 decrease in size as the depth increases. The slope of the trenches 80 plus 90 degrees forms the angle A of the epitaxial stack 30 (FIG. 1A) in the completed light emitting diodes (LED) 10 (FIG. 1A).

Figure 3I:
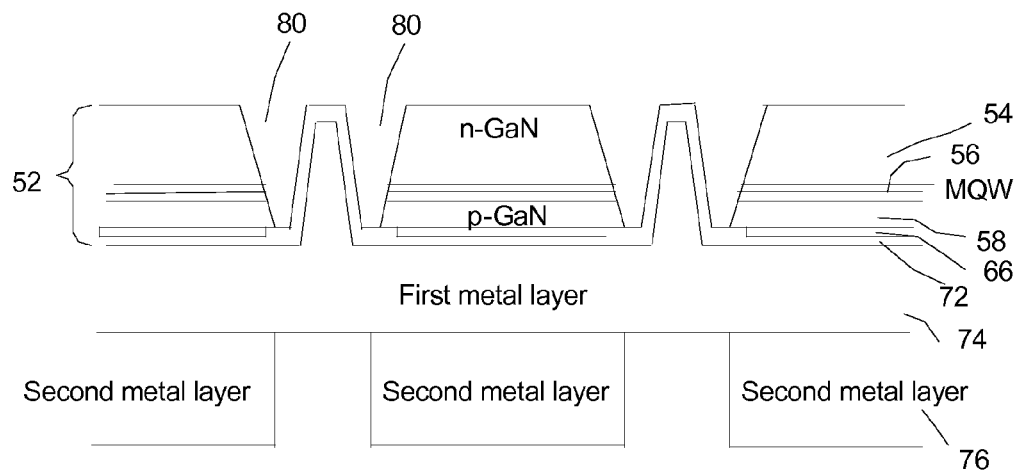

Next, as shown in FIG. 3I, the hard mask 78 can be removed using a suitable solvent or using a suitable wet or dry etching process.

Figure 3J:
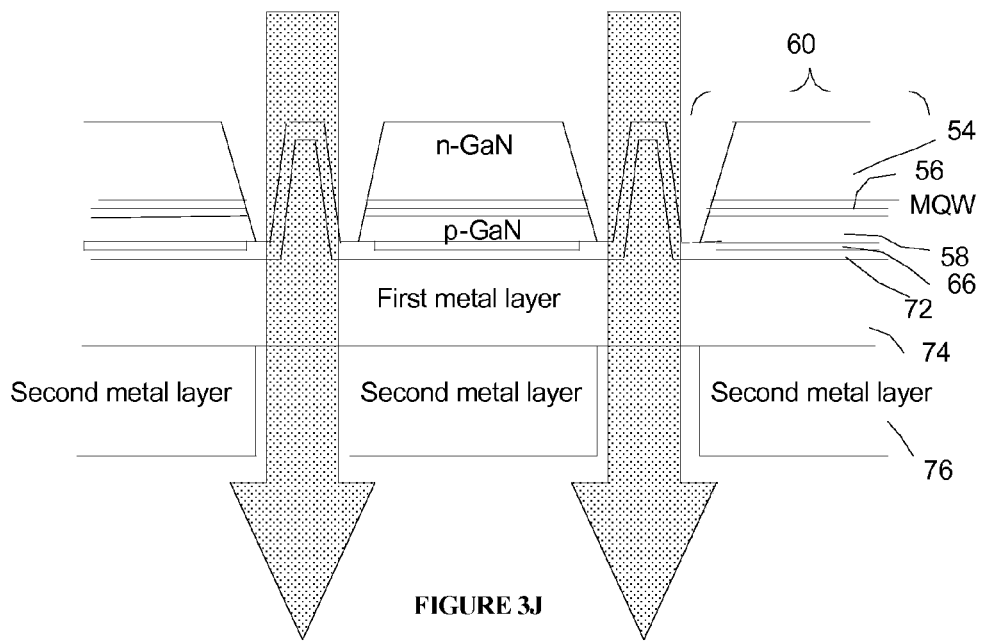

Next, as shown in FIG. 3J, a separating (or dicing) process can be performed to separate the dice 60 into separate light emitting diodes (LED) 10 (FIG. 1A). The separating process can be performed using a suitable process such as laser dicing, sawing, breaking, air knifing or water jetting. In addition, one or more anti-oxidation layers (not shown) can be applied to selected surfaces such as edges, using a suitable process, such as plating using a water jet solution.

Figure 3K:
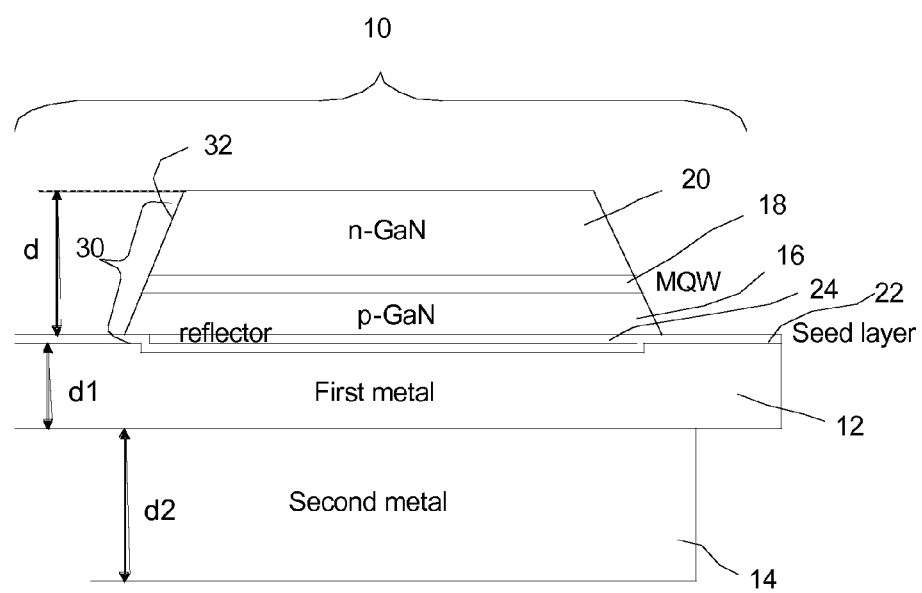

As shown in FIG. 3K, each light emitting diode (LED) 10 includes a first substrate 12 formed by a portion of the first substrate layer 74 (FIG. 3J); a second substrate 14 formed by a portion of the second substrate layer 76 (FIG. 3J); a p-type semiconductor layer 16 formed by a portion of the p-type layer 58 (FIG. 3J); a multiple quantum well (MQW) layer 18 formed by a portion of the multiple quantum well (MQW) layer 56 (FIG. 3J); and an n-type semiconductor layer 20 formed by a portion of the n-type layer 54 (FIG. 3J). Each light emitting diode die (LED) 10 also includes a seed layer 22 formed by a portion of the seed layer 72 (FIG. 3J) and a reflector layer 24 formed by a portion of the reflector layer 66 (FIG. 3J).

Thus the disclosure describes an improved light emitting diode (LED) die and method of fabrication. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating a light emitting diode die comprising:
   providing a carrier substrate;
   forming an epitaxial structure on the carrier substrate comprising a first type semiconductor layer, a multiple quantum well (MQW) layer on the first type semiconductor layer configured to emit light, and a second type semiconductor layer on the multiple quantum well (MQW) layer;
   forming a plurality of trenches through the epitaxial structure;
   forming a reflector layer on the second type semiconductor layer;
   forming a seed layer on the reflector layer and in the trenches;
   forming a first substrate layer on the seed layer configured to form a first substrate for the light emitting diode die having a first area;
   forming a second substrate layer on the first substrate layer configured to form a second substrate for the light emitting diode die having a second area less than the first area;
   patterning the second substrate layer to define the second area;
   removing the carrier substrate;
   forming a plurality of second trenches through the epitaxial structure to the seed layer to define an epitaxial stack for the light emitting diode die; and
   separating the epitaxial stack to form the first substrate with the first area and the second substrate with the second area.

2. The method of claim 1 wherein the epitaxial stack is generally pyramidal in shape with the first type semiconductor layer forming a base portion and the second type semiconductor layer forming a tip portion, and the area of the substrate is larger than the base portion.

3. The method of claim 1 the forming the plurality of second trenches step comprises etching through a hard mask.

4. The method of claim 1 wherein the first substrate and the second substrate form a stepped structure.

5. The method of claim 1 wherein the first substrate and the second substrate comprise a metal.

6. The method of claim 1 wherein the first substrate and the second substrate comprise a semiconductor material.

7. A method for fabricating a vertical light emitting diode (VLED) die comprising:
   providing a carrier substrate;
   forming an epitaxial structure on the carrier substrate comprising a first type semiconductor layer, a multiple quantum well (MQW) layer on the first type semiconductor layer configured to emit light, and a second type semiconductor layer on the multiple quantum well (MQW) layer;
   forming a plurality of trenches through the epitaxial structure;
   forming a reflector layer on the second type semiconductor layer;
   forming a seed layer on the reflector layer and in the trenches;
   forming a first substrate on the seed layer having a first surface, an opposing second surface, a first width W1 and a first area;
   forming a second substrate on the second surface of the first substrate, the second substrate having a second area, and a second width W2, with the first area and the first width W1 of the first substrate greater than the second area and the second width W2 of the second substrate; and
   removing the carrier substrate,
   wherein the first substrate and the second substrate comprise a semiconductor material.

8. The method of claim 7 wherein the first substrate and the second substrate form an overhanging protective structure for electrically and thermally connecting the (VLED) die to a LED substrate.

9. The method of claim 7 wherein the first substrate comprises Si.

10. The method of claim 7 wherein the second substrate comprises Si.

11. The method of claim 7 further comprising forming the epitaxial structure is into an epitaxial stack for the light emitting diode die having a generally pyramidal in shape with the first type semiconductor layer forming a base portion and the second type semiconductor layer forming a tip portion.

12. The method of claim 7 wherein the first type semiconductor layer comprises a p-type semiconductor layer comprising a material selected from the group consisting of GaN, AlGaN, InGaN and AlInGaN.

13. The method of claim 7 wherein the second type semiconductor layer comprises an n-type semiconductor layer comprising a material selected from the group consisting of GaN, AlGaN, InGaN and AlInGaN.

14. The method of claim 7 wherein the first type semiconductor layer comprises p-GaN and the second type semiconductor layer comprises n-GaN.

* * * * *